United States Patent
Akazawa et al.

(10) Patent No.: US 10,672,955 B2
(45) Date of Patent: Jun. 2, 2020

(54) FILLING MATERIAL, RESIN COMPOSITION, PACKAGE, AND LIGHT-EMITTING DEVICE

(71) Applicant: NICHIA CORPORATION, Anan-shi, Tokushima (JP)

(72) Inventors: Yuji Akazawa, Tokushima (JP); Koichi Okada, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 16/117,930

(22) Filed: Aug. 30, 2018

(65) Prior Publication Data
US 2019/0067528 A1    Feb. 28, 2019

(30) Foreign Application Priority Data

Aug. 31, 2017  (JP) ................... 2017-168013

(51) Int. Cl.
*H01L 33/48*   (2010.01)
*H01L 33/60*   (2010.01)
(Continued)

(52) U.S. Cl.
CPC ............ *H01L 33/486* (2013.01); *C08K 9/02* (2013.01); *C08L 77/06* (2013.01); *C08L 101/12* (2013.01);
(Continued)

(58) Field of Classification Search
CPC ................. H01L 33/486; H01L 33/60
See application file for complete search history.

(56) References Cited

U.S. PATENT DOCUMENTS 8,648,361 B2 * 2/2014 Lee .................. H01L 51/5268
257/40
8,802,976 B2 * 8/2014 Matsumoto .......... H01G 9/209
136/246
(Continued)

FOREIGN PATENT DOCUMENTS

JP    2002294070 A    10/2002
JP    2004075770 A    3/2004
(Continued)

OTHER PUBLICATIONS

Tsuyoshi Hayashi et al., Surface Coating of Natural Wollastonite Fibers with Colloidal Rutile, Journal of Ceramic Society of Japan, 108[8], 758-762, 2000 (Japanese, including English abstract).
(Continued)

*Primary Examiner* — Ida M Soward
(74) *Attorney, Agent, or Firm* — Hunton Andrews Kurth LLP

(57) ABSTRACT

A filling material for a resin composition includes a base material, a coating material coating at least a portion of a surface of a particle of the base material, and a light-reflective material disposed on the surface of the particle of the base material and supported by the coating material. The base material includes a first inorganic compound containing a Group II element. The coating material includes a second inorganic compound containing the Group II element. The second inorganic compound is different from the first inorganic compound. The light-reflective material includes a third inorganic compound having a refractive index higher than a refractive index of the first inorganic compound. A method of manufacturing the filling material is provided. A resin composition including the filling material, a package, a light-emitting device, and methods of manufacturing them are also provided.

20 Claims, 11 Drawing Sheets

(51) Int. Cl.

| | | |
|---|---|---|
| *C08K 9/02* | (2006.01) | |
| *C08L 77/06* | (2006.01) | |
| *H01L 33/56* | (2010.01) | |
| *C08L 101/12* | (2006.01) | |
| *B29L 31/34* | (2006.01) | |
| *B29C 45/14* | (2006.01) | |
| *B29K 77/00* | (2006.01) | |

(52) U.S. Cl.
CPC ............ *H01L 33/56* (2013.01); *H01L 33/60* (2013.01); *B29C 45/14639* (2013.01); *B29K 2077/00* (2013.01); *B29L 2031/3406* (2013.01); *C08K 2201/014* (2013.01); *H01L 2933/0033* (2013.01); *H01L 2933/0058* (2013.01); *H01L 2933/0091* (2013.01)

(56) References Cited

U.S. PATENT DOCUMENTS

| | | | | |
|---|---|---|---|---|
| 8,872,207 | B2 * | 10/2014 | Jeong | H01L 51/5275 257/98 |
| 9,093,666 | B2 * | 7/2015 | Young | H01L 51/5237 |
| 9,236,502 | B2 * | 1/2016 | Tischler | H01L 24/96 |
| 9,548,141 | B2 * | 1/2017 | Namiki | C09J 9/02 |
| 9,853,194 | B2 * | 12/2017 | Minato | H01L 33/505 |
| 9,929,324 | B2 * | 3/2018 | Miki | H01L 33/54 |
| 10,297,794 | B2 * | 5/2019 | Sung | H01L 51/5237 |
| 2009/0134411 | A1 | 5/2009 | Kitani et al. | |
| 2011/0134647 | A1 * | 6/2011 | Nishida | G02B 1/118 362/311.06 |
| 2013/0077321 | A1 | 3/2013 | Sato et al. | |
| 2014/0287236 | A1 | 9/2014 | Fuji et al. | |
| 2015/0295014 | A1 * | 10/2015 | Lee | H01L 27/3246 257/40 |
| 2018/0241002 | A1 * | 8/2018 | Okada | B32B 27/08 |

FOREIGN PATENT DOCUMENTS

| | | |
|---|---|---|
| JP | 2007296463 A | 11/2007 |
| JP | 2008169513 A | 7/2008 |
| JP | 2009032850 A | 2/2009 |
| JP | 2009032851 A | 2/2009 |
| JP | 2013001801 A | 1/2013 |
| JP | 2013074076 A | 4/2013 |
| JP | 2015005675 A | 1/2015 |
| WO | 2007/037355 A1 | 4/2007 |
| WO | 2013/073475 A1 | 5/2013 |

OTHER PUBLICATIONS

Yasuo Yamamoto, Zinc Oxide Serving as Functional Pigment (Japanese), Hakusuitech Co., Ltd., Retrieved on Sep. 6, 2017 from <http://www.hakusui.co.jp/report/> (Japanese).

Atuchi Kichimoto, Ultrafine Zinc Oxide (Japanese), The finish & paint, 1997.12, No. 570 (Japanese).

\* cited by examiner

FILLING MATERIAL, RESIN COMPOSITION, PACKAGE, AND LIGHT-EMITTING DEVICE

CROSS-REFERENCE TO RELATED APPLICATIONS

The present application claims priority under 35 U.S.C. § 119 to Japanese Patent Application No. 2017-168013, filed on Aug. 31, 2017, the contents of which are hereby incorporated by reference in their entirety.

BACKGROUND

1. Field of the Invention

The present disclosure relates to a filling material, a resin composition, a package, a light-emitting device, and methods of manufacturing them.

2. Description of Related Art

Resin compositions containing light-reflecting substances are widely used for packages of light-emitting devices. With recent reduction in the size and thickness of light-emitting devices, improvement of the mechanical strength of resin compositions has been demanded. For example, Japanese Patent Publication No. 2002-294070 proposes a resin composition intended to have an improved mechanical strength by adding a fibrous filling material composed of wollastonite.

The above-mentioned wollastonite is obtained by milling a silicate mineral, which is a natural mineral, into a fibrous form and is used as a filling material for the resin composition. Accordingly, while mining the silicate mineral, mineral magnetite ($Fe_3O_4$) may also be mined and incorporated as an unavoidable impurity. In addition, tools used for mining and milling the silicate mineral may wear away, resulting in iron being incorporated as an unavoidable impurity. Once the iron and magnetite (hereinafter referred to as "iron component") is incorporated into the silicate mineral, it is difficult to remove them to obtain a pure wollastonite. If, for example, a resin composition containing the wollastonite containing those unavoidable impurities is used in a package of a light-emitting device, light emitted from a light-emitting element is likely to be absorbed in the iron component contained in the wollastonite, resulting in decreased light reflection of the package. This may lead to decreased light-extraction efficiency of the light-emitting device.

In view of the foregoing, Japanese Patent Publication No. 2015-5675 (hereinafter referred to as Patent Literature 2) proposes coating the surface of fibrous particles composed of wollastonite with a particulate light-reflecting material and using the coated particles as a filling material for a resin composition. This proposal is directed to improvement in both the mechanical strength and the light reflectivity of the resin composition.

SUMMARY

According to an embodiment of the present disclosure, a filling material includes a base material, a coating material coating at least a portion of a surface of a particle of the base material, and a light-reflective material disposed on the surface of the particle of the base material and supported by the coating material. The base material comprises a first inorganic compound containing a Group II element. The coating material comprises a second inorganic compound containing the Group II element. The second inorganic compound is different from the first inorganic compound. The light-reflective material comprises a third inorganic compound having a refractive index higher than a refractive index of the first inorganic compound.

According to an embodiment of the present disclosure, a resin composition includes a light transmissive resin and the filling material dispersed in the resin. The resin has a refractive index lower than the refractive index of the first inorganic compound, higher than a refractive index of the second inorganic compound, and lower than the refractive index of the third inorganic compound.

According to an embodiment of the present disclosure, a package has a recess for mounting a light-emitting element, wherein the recess has an inner surface having at least a portion comprising the resin composition.

According to an embodiment of the present disclosure, a light-emitting device includes the package and a light-emitting element mounted in the recess.

According to an embodiment of the present disclosure, a method of manufacturing a filling material includes: a first step of subjecting a base material to a chemical surface treatment, the base material comprising a first inorganic compound containing a Group II element, and thereby forming a coating material on a surface of the base material, wherein the coating material comprises a second inorganic compound containing the Group II element, the second inorganic compound being different from the first inorganic compound; a second step of subjecting the base material on which the coating material has been formed to a chemical surface treatment, and thereby forming a light-reflective material on the surface of the base material, wherein the light-reflective material comprises a third inorganic compound having a refractive index higher than a refractive index of the first inorganic compound; and a third step of, after the second step, melting the coating material by heating the coating material to a heating temperature such that the coating material melts and the base material and the light-reflective material do not melt, and thereby causing the coating material to support the light-reflective material on the surface of the base material.

According to an embodiment of the present disclosure, a method of manufacturing a resin composition includes: preparing the filling material in accordance with the above-described method of manufacturing a filling material, and mixing the filling material and a resin. The resin has a refractive index lower than the refractive index of the first inorganic compound, higher than a refractive index of the second inorganic compound, and lower than the refractive index of the third inorganic compound.

According to an embodiment of the present disclosure, a method of manufacturing a package includes: preparing a resin composition in accordance with the above-described method of manufacturing a resin composition, and forming a resin-molded body having a recess for mounting a light-emitting element using the resin composition.

According to an embodiment of the present disclosure, a method of manufacturing a light-emitting device includes: preparing a package in accordance with the above-described method of manufacturing a package, and mounting a light-emitting element in the recess of the package.

BRIEF DESCRIPTION OF THE DRAWINGS

A more complete appreciation of embodiments of the invention and many of the attendant advantages thereof will be readily obtained by reference to the detailed description below when considered in connection with the accompanying drawings.

DESCRIPTION OF EMBODIMENTS

Hereinafter, a description is given of a light-emitting device according to an embodiment of the present disclosure.

The drawings referenced in the following description schematically show the embodiment. Thus, the scale of members, distances between members, positional relations between members or the like may be presented in an exaggerated manner, and illustration of a part of a member may be omitted. Furthermore, the scale and distances between members may not match between a perspective view and its corresponding cross-sectional view. In the description below, members that are the same or analogous are given the same name or number in principle, and duplicative detailed descriptions are appropriately omitted.

It is to be noted that, in a light-emitting device and a method of manufacturing the device according to the embodiment, interpretation of directions like "up", "down", "left", and "right" should be interchanged according to the situation. It is to be noted that, directions like "up" and "down" are used to represent relative positions between constituent elements in a drawing referenced for explanation and are not intended to specify the absolute positions unless otherwise stated.

A particle diameter is, unless otherwise stated, indicated by an average particle diameter determined as a Fisher Sub Sieve Sizer's No. (F.S.S.S.No.) using an air permeation method. Specifically, under an environment of a temperature of 25° C. and a humidity of 70%, 1 cm$^3$ of a sample is measured and packed in a special tubular vessel and then a dry air is passed through the vessel at a constant pressure. The specific surface area is obtained based on the difference in the pressure and converted to the average particle diameter.

Embodiment

Configuration of Light-Emitting Device

Figure 1:
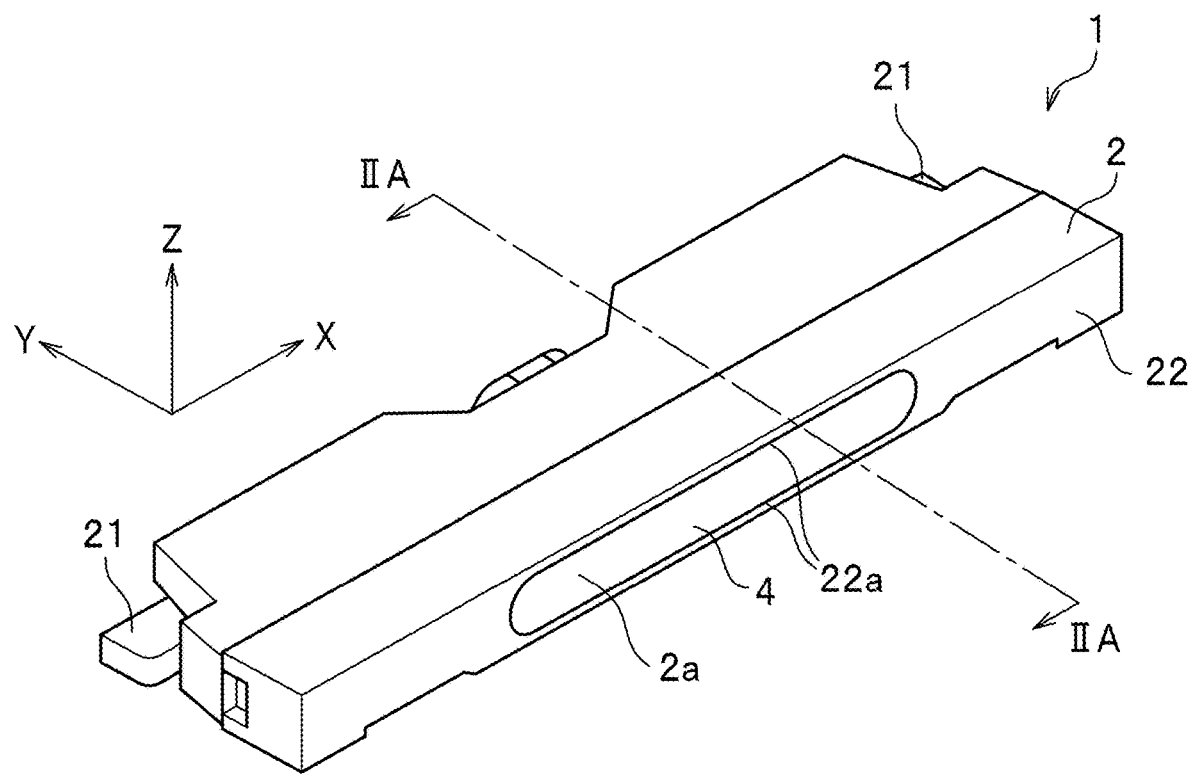
FIG. 1 is a perspective view showing a light-emitting device according to an embodiment of the present disclosure.
Figure 2A:
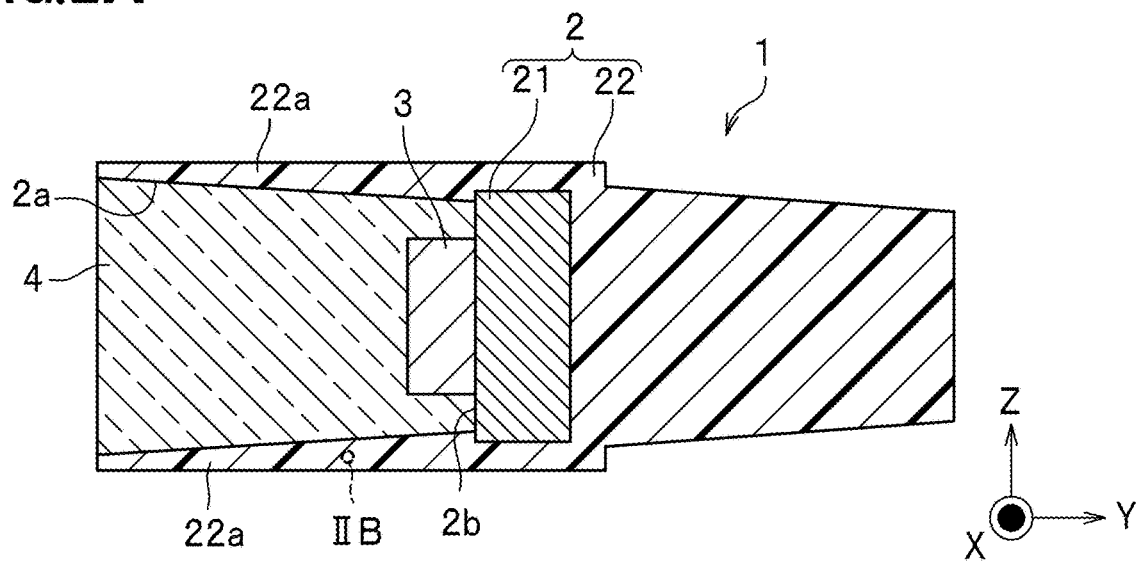
FIG. 2A is a cross-sectional view taken along line IIA-IIA in FIG. 1.
Figure 2B:
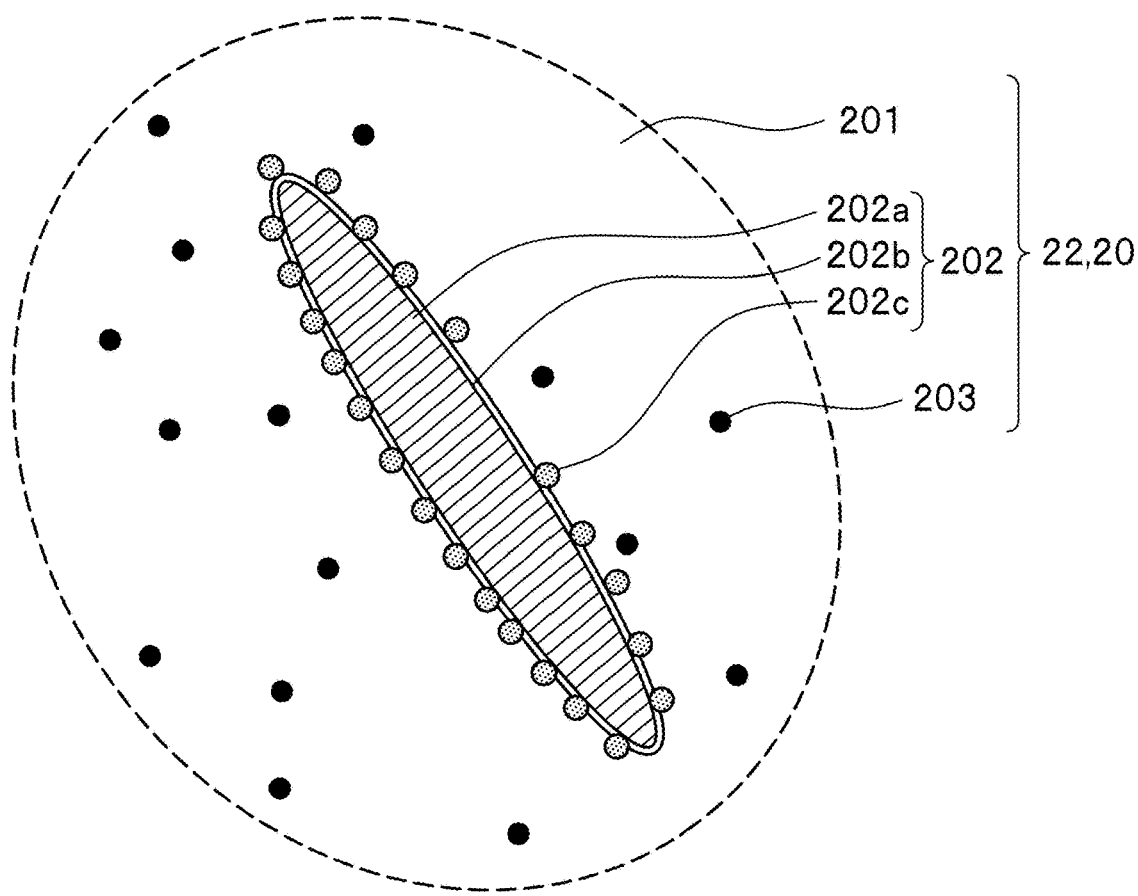
FIG. 2B is a schematic diagram of a resin composition according to the embodiment, partially enlarging region IIB shown in FIG. 2A.

A description is given of the configuration of a light-emitting device according to an embodiment with reference to FIGS. 1 to 2B. FIG. 1 is a perspective view illustrating the configuration of the light-emitting device according to the embodiment. FIG. 2A is a cross-sectional view taken along line IIA-IIA of FIG. 1, illustrating the configuration of the light-emitting device according to the embodiment. FIG. 2B is a schematic diagram illustrating an enlarged view of region IIB of a resin-molded body in the light-emitting device shown in FIG. 2A.

In FIGS. 1 and 2A, XYZ-axis coordinates are indicated for the sake of illustration. The X-axis is in a longitudinal direction of the light-emitting device 1 having an elongated, substantially rectangular parallelepiped shape; the Y axis is in a lateral direction of the light-emitting device 1; and the Z-axis is in a thickness direction of the light-emitting device 1.

The light-emitting device 1 according to the embodiment includes a package 2 having a recess 2a, a light-emitting element 3 mounted on a bottom surface 2b of the recess 2a, and a light-transmissive sealing member 4 disposed in the recess 2a to seal the light-emitting element 3. The package 2 includes a pair of lead electrodes 21 and a resin-molded body 22 holding the pair of lead electrodes 21.

The external shape of the light-emitting device 1 is an elongated, substantially rectangular parallelepiped shape and has a thin thickness, which corresponds to the dimension of the light-emitting device 1 in the Z-axis direction. The light-emitting device 1 has an end surface located furthest in the negative Z-axis direction and serving as a mounting surface. The recess 2a of the light-emitting device 1 is formed such as to have an opening at an end side of the light-emitting device 1 located furthest in the negative Y-axis direction. Thus, the light-emitting device 1 is suitable to the side-view mounting in which the light-emitting device 1 emits light in a direction parallel to the mounting surface.

In the light-emitting device 1 according to the embodiment, the resin-molded body 22 of the package 2 is formed using a resin composition 20 containing a resin 201 containing a first filling material 202 for improving the mechanical strength of the resin 201. The first filling material 202 may contain a fibrous base material 202a, a coating material 202b coated on a surface of the base material 202a to enhance light reflectivity, and a light-reflective material 202c disposed on the surface of the base material 202a and supported by the coating material 202b to enhance light reflectivity. The resin composition 20 may further contain a second filling material 203 for enhancing light reflectivity or other filling materials.

The surface of the base material 202a means an external surface thereof. It should be noted that the phrase "light-reflective material 202C disposed on a surface of the base material 202a and supported by the coating material 202b" covers a light-reflective material 202C disposed in contact with the surface of the base material 202a and supported by the coating material 202b as well as a light-reflective material 202C disposed apart from the surface of the base material 202a and supported by the coating material 202b.

Package

The package 2 includes the pair of lead electrodes 21 and the resin-molded body 22 that holds the pair of lead electrodes 21 such that the pair of lead electrodes are spaced apart from each other. In the present embodiment, the opening of the recess 2a of the package 2 opens laterally in a direction parallel to the end surface located furthest in the negative Z-axis direction and serving as the mounting surface. The bottom surface 2b of the recess 2a is formed substantially perpendicular to the mounting surface.

The bottom surface 2b of the recess 2a is constituted by the pair of lead electrodes 21 and the resin-molded body 22; and side surfaces of the recess 2a are constituted by sidewalls 22a of the resin-molded body 22. One pair of the sidewalls 22a located opposite in the Z-axis direction and constituting upper and lower side surfaces of the recess 2a have a smaller thickness than the other pair of the sidewalls 22a located opposite in the X-direction and constituting lateral side surfaces of the recess 2a.

The light-emitting element 3 is disposed in the recess 2a. The sidewalls 22a are formed such as to surround the light-emitting element 3. The sidewalls 22a are formed to have inner surfaces inclined at a predetermined angle relative to the bottom surface 2b such that the recess 2a expands from the bottom surface 2b to the opening of the recess 2a. With this structure, light emitted from the light-emitting element 3 in lateral directions thereof is reflected by the sidewalls 22a toward the opening and extracted from the package 2.

The resin-molded body 22 comprises the resin composition 20 having good light-reflecting properties so that the light from the light-emitting element 3 is reflected by the resin-molded body 22 and efficiently extracted from the opening of the recess 2a.

Recently, packages have been made thinner and thinner in response to an increasing demand for smaller light-emitting devices. For this reason, specifically, it is desirable that the resin-molded body 22 surrounding the light-emitting element 3 has a portion having a thickness of 100 μm or less, or more desirably a thickness of 50 μm or less.

In the package 2 according to the present embodiment, the opening of the recess 2a is of an oval shape. The package 2 can be formed to have a small outer dimension in the thickness direction without changing the dimensions of the recess 2a, by forming the pair of sidewalls 22a extending in the lengthwise direction of the opening of the recess 2a to have a small thickness. This structure enables making the light-emitting device 1 thin.

The sidewalls 22a can have necessary mechanical strength even when formed to have a small thickness, by being formed of the resin composition 20 containing the fibrous first filling material 202. The sidewalls 22a exhibit necessary light reflectivity even when formed to have a small thickness, because the coating material 202b for supporting the light-reflective material 202c is disposed on the surface of the first filling material 202 (surface of the base material 202a).

Although the opening of the recess 2a of the package 2 in the present embodiment is of an oval shape, the shape of the opening may be a circular shape, an elliptical shape, or another polygonal shape.

Lead Electrode

The lead electrodes 21 are wiring lines for connecting an external power source and the light-emitting element 3. The pair of lead electrodes 21 of the package 2 in the present embodiment correspond to an anode and a cathode of the light-emitting element 3. When a plurality of light-emitting elements 3 are to be mounted, three or more lead electrodes 21 may be provided according to the electrical connection manner of the light-emitting elements 3.

The pair of lead electrodes 21 is formed in the bottom surface 2b of the recess 2a such as to be exposed from the resin-molded body 22. The pair of lead electrodes 21 is arranged such as to occupy a half or more of the area of the bottom surface 2b of the recess 2a. The light-emitting element 3 is connected with the pair of lead electrodes 21 at portions thereof exposed on the bottom surface 2b, via electrically conductive members such as wires and solder. In the present embodiment, the light-emitting element 3 is bonded to the pair of lead electrodes 21 at the portions thereof exposed on the bottom surface 2b.

Each of the pair of lead electrodes 21 has an outer portion projecting out of the resin-molded body 22 and bent to be arranged on a lower surface of the package 2, i.e., the mounting surface. The light-emitting device 1 is bonded to an external circuit board or the like via the outer portions of the pair of lead electrodes 21 arranged on the lower surface of the package 2.

The lead electrodes 21 may have any shape depending on the shape of the package 2. For example, the lead electrodes 21 may have a plate-like form, a block-like form, or a film-like form, and may have a wavy surface or an uneven surface. The lead electrodes 21 may each have a uniform thickness, or may each partially have a thick portion and/or a thin portion. Although not particularly limited, the lead electrodes 21 preferably have a wide width for the purpose of improving heat dissipation. Although not particularly limited, the material of the lead electrodes 21 preferably has comparatively high electrical conductivity and comparatively high thermal conductivity. The lead electrodes 21 made of such a material allows for efficient dissipation of the heat generated by the light-emitting element 3 to the outside. For example, preferably, the material for the lead electrodes 21 is a material having a large thermal conductivity of about 200 W/m·K or more, a material having a comparatively large mechanical strength, or a material easy to punch or etch. Specific examples of the material for the lead electrodes 21 include: metals such as copper, aluminum, gold, silver, tungsten, iron, and nickel; and alloys such as iron-nickel alloys and phosphor bronze. Preferably, the lead electrodes 21 have surfaces plated with a metal having good light-reflecting properties, such as silver and aluminum, to efficiently extract light from the light-emitting element 3 mounted on the lead electrodes 21. Preferably, the plated surface has a glossiness of 0.2 to 2.0, from the viewpoint of light extraction efficiency and manufacturing cost.

Resin-Molded Body

The resin-molded body 22 is formed to provide the recess 2a, the purpose of which is to hold the lead electrodes 21 and mount the light-emitting element 3 together with the lead electrodes 21. In the resin-molded body 22, at least the sidewalls 22a constituting the side surfaces of the recess 2a comprises the resin composition 20 having good mechanical strength and light reflectivity.

The resin-molded body 22 may be formed by a known resin molding method, such as transfer molding, injection molding, compression molding, and extrusion molding.

Resin Composition

The resin composition 20 is used as the material for the resin-molded body 22. The resin-molded body 22 can be formed using the resin composition 20 by any one of the above-described known resin molding methods.

The resin composition 20 includes the light-transmissive resin 201 containing the first filling material 202 for improving mechanical strength and light reflectivity. The resin composition 20 in the present embodiment may include the second filling material 203 for further improving light reflectivity.

The resin composition 20 may include additional materials conventionally used for synthetic resins in addition to the first filling material 202 and the second filling material 203, so long as the preferred characteristics of those filling materials are not impaired. Examples of such additional materials include: inorganic filling materials such as talc, silica, and zinc oxide; flame retardants; plasticizers; diffusing agents; dyes; pigments; releasants; ultraviolet absorbers; antioxidants; thermostabilizers; and combinations of the foregoing. Herein, the pigments include white pigments.

Resin

The resin 201 serves as a base material of the resin composition. The resin 201 contains the first filling material 202 and the second filling material 203, to constitute the resin composition 20.

Preferably, the resin 201 contains a resin material having good light-transmissive properties. Examples of such a resin material include thermoplastic resins, such as liquid crystal polymers, polyamide resins, polyphthalamide resins, and polybutylene terephthalates. Alternatively, the resin 201 may be a thermosetting resin, examples of which include epoxy resins, silicone resins, phenolic resins, urea resins, melamine resins, and unsaturated polyester resins. Thermoplastic resins are very inexpensive compared to ceramics, and thus are useful in providing low-cost light-emitting devices. Thermosetting resins have better heat resistance than thermoplastic resins, and thus are useful in providing light-emitting devices having good heat resistance.

First Filling Material

The first filling material 202 is a granular filler to be contained in the resin 201 to enhance the mechanical strength of the resin-molded body 22 using the resin composition 20. Preferably, the particles of the first filling material 202 are of an elongated shape, such as a fibrous shape, a needle-like shape, or a stick-like shape, from the viewpoint of enhancing the mechanical strength of the resin-molded body 22. In addition, the particles of the first filling material 202 preferably have a certain size. If the particles of the first filling material 202 are too large, the resin-molded body 22 may have a surface with unevenness, which causes insufficient adhesion to the sealing member 4, resulting in a separation between the resin-molded body 22 and the sealing member 4. Under the condition that the total volume of the first filling material 202 in the resin-molded body 22 is the same, the smaller the volume of each individual particle of the first filling material 202, the larger the total surface area of the first filling material 202. The larger the total surface area of the first filling material 202 in the resin-molded body 22, the greater the light reflectivity of the resin-molded body 22.

The content of the first filling material 202 in the resin composition 20 is preferably from 5 to 70 percent by mass, or more preferably from 10 to 70 percent by mass. The inclusion of the first filling material 202 within these content ranges may enable the resin-molded body 22 to satisfy high levels of requirements in terms of obtaining mechanical properties and optical properties required of the package 2 of the light-emitting device 1.

Note that the first filling material 202 may contain two or more kinds of materials whose particles have different shapes.

Preferably, the elongated-shaped particles of the first filling material 202 are randomly oriented in the resin-molded body 22, which may make the mechanical strength of the resin-molded body 22 close to isotropic. Further, making both the resin-molded body 22 and the sealing member 4 have isotropic mechanical strength makes them have the same behavior in terms of their expansions and contractions due to temperature changes, which may inhibit the occurrence of a separation between the resin-molded body 22 and the sealing member 4 at an interface therebetween.

Meanwhile, the elongated-shaped particles of the first filling material 202 may be arranged in the resin-molded body 22 so as to be oriented in a predetermined direction. Because the resin composition 20 is filled into a mold with a predetermined pressure when molding the resin-molded body 22, the particles of the first filling material 202 may be oriented in the same direction, which makes the formed resin-molded body 22 have an anisotropic mechanical strength. This may enhance the mechanical strength of the resin-molded body 22 in a predetermined direction.

Base Material, Coating Material, and Light-Reflective Material

To enhance the light reflectivity of the resin composition 20, in the first filling material 202, the surface of the base material 202a is coated with the coating material 202b, which has good light-transmissive properties and serves to support the light-reflective material 202c on the surface of the base material 202a. Preferably, the coating material 202b has better light-transmissivity than the base material 202a. More preferably, the base material 202a has a refractive index higher than that of the resin 201, the coating material 202b has a refractive index lower than that of the resin 201, and the light-reflective material 202c has a refractive index higher than that of the resin 201. Such a configuration makes the resin composition 20 have a higher light reflectance compared to a case in which the first filling material 202 is solely composed of a base material 202a without the coating material 202b and the light-reflective material 202c.

The coating material 202b and the light-reflective material 202c may be disposed such as to cover at least a portion of the surface of each particle of the base material 202a. It is, however, preferable that the coating material 202b and the light-reflective material 202c be disposed such as to continuously cover the entire surface of each particle of the base material 202a to enhance the light reflectivity of the resin composition 20.

The average fiber diameter, i.e., minor diameter, of the particles of the base material 202a is preferably from 0.1 μm to 30 μm, more preferably from 0.1 μm to 15 μm, or still more preferably from 2 μm to 7 μm; the average fiber length, i.e., major diameter, of the particles of the base material 202a is preferably from 1 μm to 100 μm, more preferably from 3 μm to 100 μm, or still more preferably from 20 μm to 50 μm; and the average aspect ratio, i.e., ratio of major diameter to minor diameter, of the particles of the base material 202a is preferably 3 or more, more preferably from 3 to 50, or still more preferably from 5 to 30.

Wollastonite, a kind of calcium silicate, can be used as the first filling material 202 to enhance the mechanical strength. As described above, wollastonite generally contains iron as an unavoidable impurity. When iron is mixed into the wollastonite as an impurity, the iron is likely to absorb light from the light-emitting element 3 and light obtained by converting the wavelength of the light from the light-emitting element 3 by phosphors or the like. An interface between a filler and the resin 201 reflects light according to the difference between the refractive indices of the filler and the resin 201. A portion of the light incident on the interface propagates into the filler and is absorbed by the iron impurity. For this reason, use of a resin composition 20 containing a filler including wollastonite may result in poor light reflectivity.

For example, it is preferable that the base material 202a have a refractive index of from 1.60 to 1.80, the resin 201 have a refractive index of from 1.48 to 1.59, the coating material 202b have a refractive index of from 1.35 to 1.47, and the light-reflective material 202c have a refractive index of from 1.70 to 2.70. Use of materials satisfying these conditions may enhance light reflectivity.

A description is given of an example in which: wollastonite (refractive index: 1.63) is used as the base material 202a; calcium fluoride (refractive index: 1.43) is used as the coating material 202b; zirconia (refractive index: 2.20) is used as the light-reflective material 202c; and polyamide resin (refractive index: 1.50) is used as the resin 201.

In a comparative example of resin composition in which a filler containing the wollastonite but not containing the coating material 202b and the light-reflective material 202c is used, the difference in the refractive index between the filler and the resin 201 is 0.13, and the refractive index of the filler is greater than that of the resin 201. Accordingly, the light propagating in the resin 20 is reflected at an interface between the filler and the resin 201 with a reflectance according to the difference in the refractive index.

In the example using the filler containing the wollastonite, the coating material 202b of calcium fluoride, and the light-reflective material 202c of zirconia, the resin 201 and the light-reflective material 202c have an interface therebetween having a difference of 0.7 (2.20−1.50) in the refractive index, and the light-reflective material 202c and the base material 202a have an interface therebetween having a difference of 0.57 (2.20−1.63) in the refractive index. Namely, the example has an interface between the light-reflective material 202c and the base material 202a whose difference in the refractive index is greater than that of the interface between the filler and the resin 201 in the resin composition of the comparative example. Those interfaces efficiently reflect light, resulting in reduction in the amount of light that propagates into the base material 202a and is absorbed therein. Therefore, the configuration of the example may improve light reflectivity of the resin composition 20.

Note that, because the coating material 202b has a lower refractive index than the resin 201 and the light-reflective material 202c, total reflection according to the Snell's law does not occur in light incident from the coating material 202b to the interface between the coating material 202b and the light-reflective material 202c. That means the light propagating in the coating material 202b is transmitted to the light-reflective material 202c in a comparatively efficient manner, which may enhance the light reflectivity of the resin composition 20.

As the material for the base material 202a, a first inorganic compound containing a Group II element may be used. Preferably, the Group II element is Ca or Mg. Specifically, examples of the first inorganic compound include calcium silicate and magnesium silicate. In particular, a wollastonite composed of calcium metasilicate, which is a kind of calcium silicate, can be easily processed into fibrous particles by crushing, and thus is preferred as the base material 202a of the first filling material 202 in terms of enhancing the mechanical strength of the resin composition 20.

As the material for the coating material 202b, a second inorganic compound containing the Group II element contained in the chemical composition of the first inorganic compound, which is used for the base material 202a, may be used. The second inorganic compound is different from the first inorganic compound. Preferably, the second inorganic compound has a smaller refractive index than the first inorganic compound and the resin 201 used in the resin composition 20.

Specifically, the second inorganic compound is preferably selected from the group consisting of a fluoride including the Group II element, a phosphate including the Group II element, and a sulfate including the Group II element. For example, when the Group II element is Ca, examples of the second inorganic compound include calcium fluoride ($CaF_2$), calcium hydrogen phosphate ($CaHPO_4$), and calcium sulfate ($CaSO_4$). When the Group II element is Mg, examples of the second inorganic compound include magnesium fluoride ($MgF_2$), magnesium hydrogen phosphate ($MgHPO_4$), and magnesium sulfate ($MgSO_4$).

As the material for the light-reflective material 202c, a compound having a higher refractive index than the base material 202a is used.

Specifically, examples of such a compound include a compound selected from the group consisting of titanium oxide, zirconium oxide, zinc oxide, and aluminum oxide.

To further improve the mechanical strength or the like of the resin-molded body 22, the first filling material 202 may be subjected to a known surface treatment using a silane coupling agent or a titanium coupling agent. As the agent for use in the surface treatment, a silane coupling agent, in particular, amino silane is preferred. Surface treatment with a silane coupling agent or the like improves adhesion between the first filling material 202 and the resin 201, and thus enhances the mechanical strength of the resin-molded body 22. In addition, the surface treatment improves sliding properties of the surface of the first filling material 202, and thus improves fluidity of the resin composition 20 before being cured. Due to the improved fluidity, when molding the resin composition 20, the resin composition 20 before being cured can be distributed throughout a mold cavity.

Second Filling Material

The second filling material 203 is a filler that is added to the resin composition 20 when the resin composition 20 is required to have a light reflectivity higher than that imparted by the first filling material 202. The second filling material 203 may be arranged in the resin-molded body 22 molded using the resin composition 20 so that the second filling material 203 may be uniformly dispersed in the resin-molded body 22 or unevenly distributed and concentrated at or near an surface of the resin-molded body 22. Preferably, the second filling material 203 has insulation properties. The second filling material 203 having insulation properties prevents the pair of lead electrodes 21 from being shorted via the second filling material 203. Thus, the second filling material 203 can be contained in the resin-molded body 22 at a comparatively high content.

Preferably, the material for the second filling material 203 has a refractive index largely different from that of the resin 201 used in the resin composition 20. For example, particles of titanium oxide ($TiO_2$) or aluminum oxide ($Al_2O_3$) may be used for the second filling material 203. The diameter of the particles of the second filling material 203 is preferably in a range of 0.08 μm to 10 μm, or more preferably in a range of 0.1 μm to 5 μm, so as to obtain light-scattering effects at high efficiency. The content of the second filling material 203 in the resin composition 20 is preferably 10 percent by mass to 60 percent by mass, or more preferably 20 percent by mass to 50 percent by mass, so as to enhance light reflectivity within a range where the formability of the resin composition 20 is not impaired.

Light Emitting Element

The light-emitting element 3 may be made by forming a semiconductor such as GaAlN, ZnS, ZnSe, SiC, GaP, GaAlAs, AlN, InN, AlInGaP, InGaN, GaN, or AlInGaN on a sapphire substrate or the like as a light-emitting layer. Of these, a nitride-based compound semiconductor element having a peak emission wavelength in a short wavelength range from a ultraviolet region to a visible light region (360 nm to 550 nm) may be used. Even when a light-emitting element 3 having high light emission output is used, as the resin-molded body 22 has high light reflectivity by containing the first filling material 202 including the base material 202a the surface of which is covered by the coating material 202b and the light-reflective material 202c, the light from the light-emitting element 3 is likely to be unable to penetrate into the resin-molded body 22. Accordingly, it may be possible to inhibit degradation of the resin-molded body 22 due to light, and thus improve the light resistance of the package 2.

Incidentally, it may also be possible to use a light-emitting element having a peak emission wavelength in a long wavelength range of visible light (551 nm to 780 nm).

A plurality of light-emitting elements 3 may be used. Using light-emitting elements 3 having different emission colors allows for providing a light-emitting device 1 having a wide color reproduction range. For example, two light-emitting elements 3 capable of emitting green light, one light-emitting element 3 capable of emitting blue light, and one light-emitting element 3 capable of emitting red light may be used.

To use the light-emitting device 1 for pixels of a full-color display device, it is preferable that the emission wavelength of the red light-emitting element 3 be from 610 nm to 700 nm, the emission wavelength of the green light-emitting elements 3 be from 495 nm to 565 nm, and the emission wavelength of the blue light-emitting element 3 be from 430 nm to 490 nm. When the light-emitting device 1 is configured to emit white mixed-color light, taking into account the complementary relation in the emission wavelength between the color of the light-emitting element 3 and the color of the fluorescent substance contained in the sealing member 4, and the deterioration of the sealing member 4 caused by the optical output of the light-emitting element 3, the emission wavelength of the light-emitting elements 3 is preferably 400 nm or more and 530 nm or less, or more preferably 420 nm or more and 490 nm or less.

Sealing Member

The sealing member 4 is disposed in the recess 2a of the package 2 to seal the light-emitting element 3, the lead electrodes 21, and wires connecting the light-emitting element 3 and the lead electrodes 21, which are arranged in the recess 2a. Optionally, the sealing member 4 may be omitted. However, the sealing member 4 serves to protect the sealed members from degradation due to moisture and gases, and damages due to physical contacts.

The material usable for the sealing member 4 is not limited. However, it is preferable that the sealing member 4 has good light-transmissive properties. Examples of such a material include: resin material such as silicone resins and epoxy resins, and inorganic materials such as glass.

The sealing member 4 may contain: fluorescent substance that performs wavelength conversion on the light from the light-emitting element 3, and light-reflecting substance that scatters the light from the light-emitting element 3. As the light-reflecting substance, the same materials as the above-described materials for the second filling material 203 may be used.

As the fluorescent substance, one that absorbs the light from the light-emitting element 3 and converts the absorbed light to light having a wavelength different from that of the absorbed light may be used. For example, it is preferable to employ a material selected from the group consisting of: aluminum-garnet based phosphors; nitride-based phosphors, oxynitride-based phosphors, and sialon-based phosphors which are activated mainly with a lanthanoid element such as Eu or Ce; alkaline-earth halogen apatite phosphors, alkaline-earth metal boric acid halogen phosphors, alkaline-earth metal aluminate phosphors, alkaline-earth silicate, alkaline-earth sulfide, alkaline-earth thiogallates, alkaline-earth silicon nitrides, and germanates which are activated mainly with a lanthanoid element such as Eu and/or a transition-metal element such as Mn; rare-earth aluminates and rare-earth silicates which are activated mainly with a lanthanoid element such as Ce; organic compounds and organic complexes which are activated mainly with a lanthanoid element such as Eu; and mixtures thereof.

Method of Manufacturing Light-Emitting Device

Figure 3:
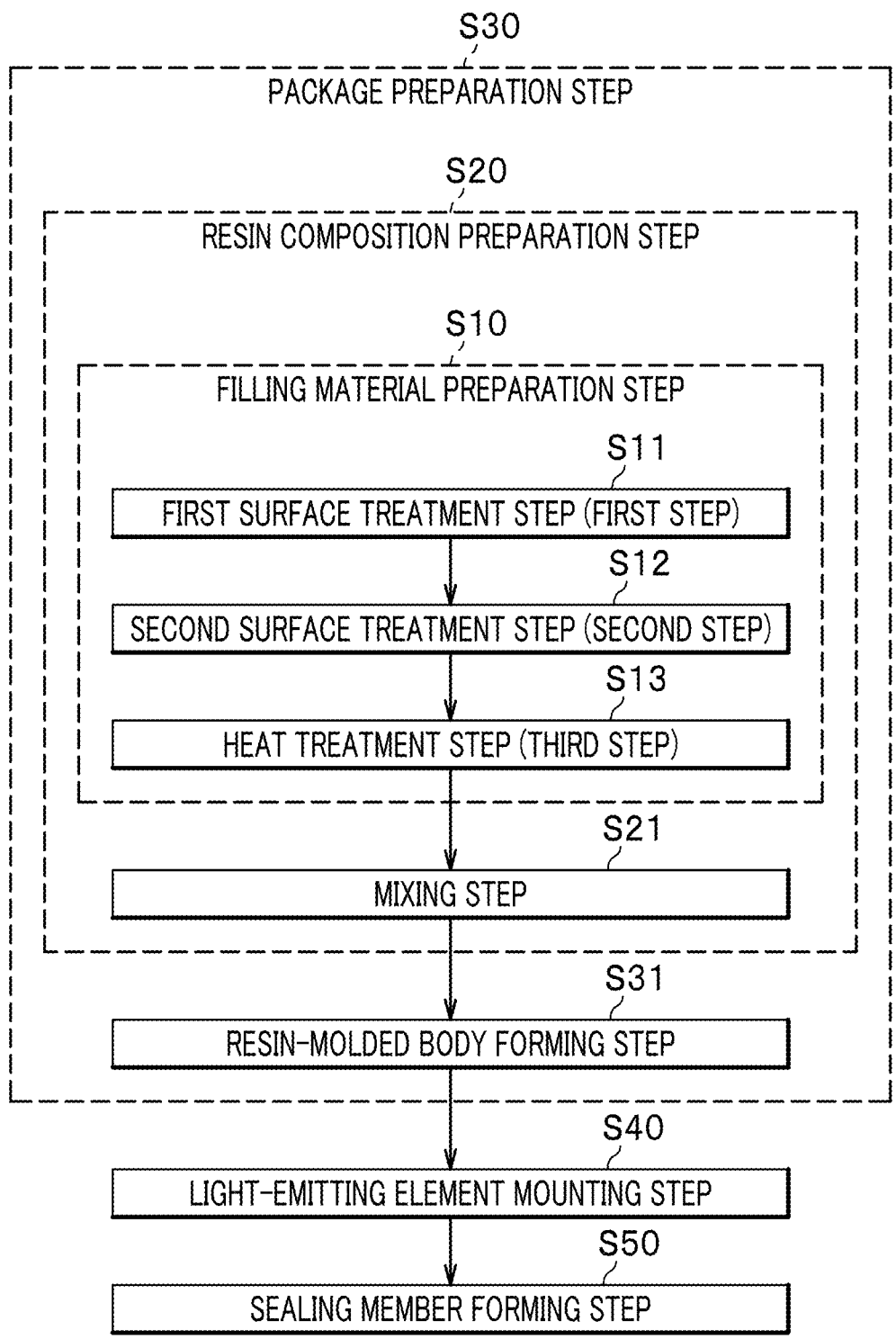
FIG. 3 is a flowchart of a method of manufacturing a light-emitting device according an embodiment of the present disclosure.
Figure 4A:
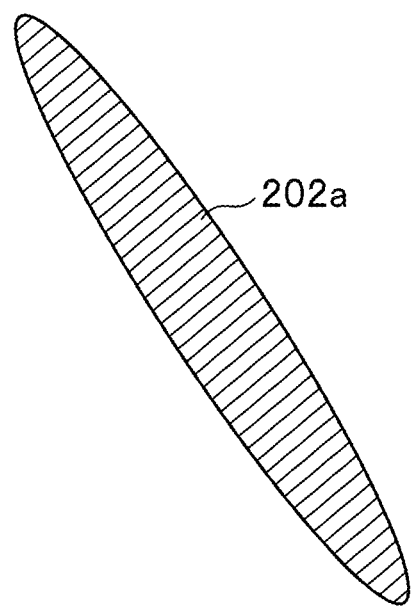
FIG. 4A is a schematic cross-sectional view illustrating a particle of a first inorganic compound, which is an original material of a first filling material, in the method of manufacturing a light-emitting device according to the embodiment of the present disclosure.
Figure 4B:
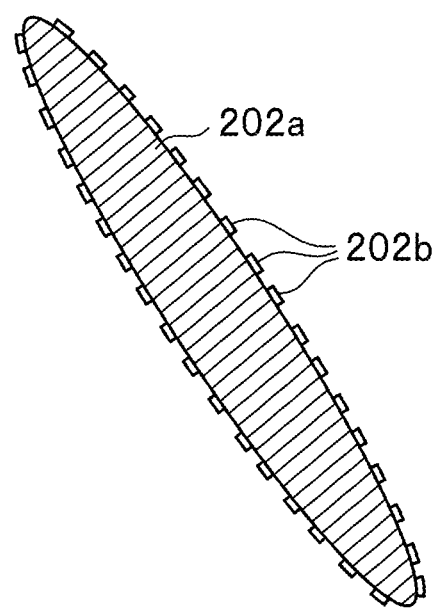
FIG. 4B is a schematic cross-sectional view illustrating the particle of the first filling material after being subjected to a first surface treatment step in the method of manufacturing a light-emitting device according to the embodiment of the present disclosure.
Figure 4C:
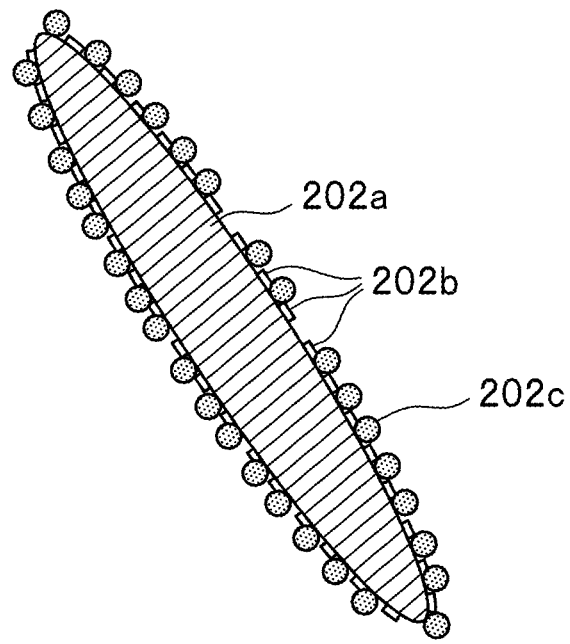
FIG. 4C is a schematic cross-sectional view illustrating the particle of the first filling material after being subjected to a second surface treatment step in the method of manufacturing a light-emitting device according to the embodiment of the present disclosure.
Figure 4D:
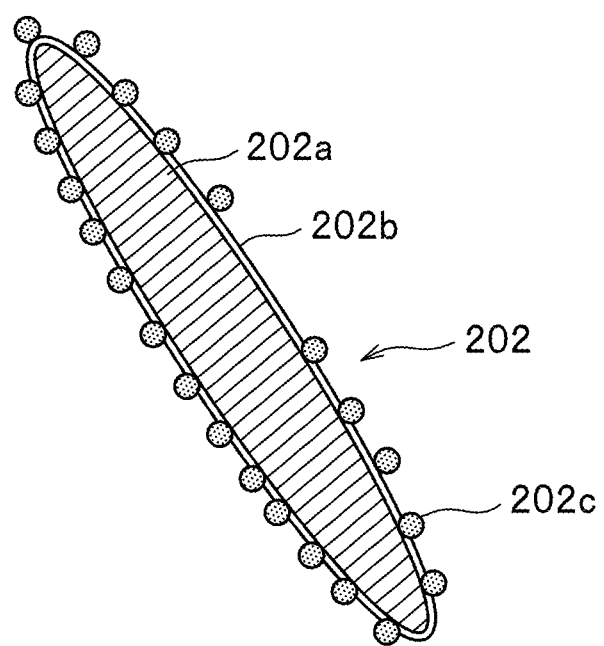
FIG. 4D is a schematic cross-sectional view illustrating a particle of the first filling material after being subjected to a heat treatment step in the method of manufacturing a light-emitting device according to the embodiment of the present disclosure.
Figure 4E:
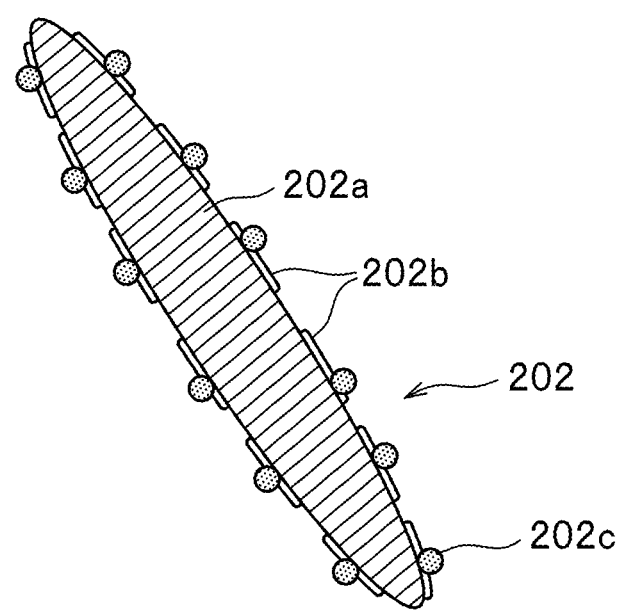
FIG. 4E is a schematic cross-sectional view illustrating another particle of the first filling material after being subjected to the heat treatment step in the method of manufacturing a light-emitting device according to the embodiment of the present disclosure.

Next, a description is given of a method of manufacturing the filling materials, resin composition, package, and light-emitting device with reference to FIGS. 1 to 4E. FIG. 3 is a flowchart illustrating the flow of a method of manufacturing the light-emitting device according to the embodiment. FIG. 4A is a schematic cross-sectional view illustrating a particle of a first inorganic compound, which is the material for the first filling material in the method of manufacturing the light-emitting device according to the embodiment. FIG. 4B is a schematic cross-sectional view illustrating the particle of the first filling material which has been subjected to a first surface treatment step in the method of manufacturing the light-emitting device according to the embodiment. FIG. 4C is a schematic cross-sectional view illustrating the particle of the first filling material which has been subjected to a second surface treatment step in the method of manufacturing the light-emitting device according to the embodiment. FIG. 4D is a schematic cross-sectional view illustrating an example of the particle of the first filling material which has been subjected to a heat treatment step in the method of manufacturing the light-emitting device according to the embodiment. FIG. 4E is a schematic cross-sectional view illustrating another example of a particle of the first filling material which has been subjected to the heat treatment step in the method of manufacturing the light-emitting device according to the embodiment.

Note that the example of the particle of the first filling material shown in FIG. 4D indicates that the surface of the base material is entirely coated by coating material, and the another example of the particle of the first filling material shown in FIG. 4E indicates that the surface of the base material is partially coated by coating material.

The method of manufacturing a light-emitting device according to the present embodiment includes: a filling material preparation step S10, a mixing step S21, a resin-molded body forming step S31, a light-emitting element mounting step S40, and a sealing member forming step S50. The filling material preparation step S10 includes: a first surface treatment step (first step) S11, a second surface treatment step (second step) S12, and a heat treatment step (third step) S13.

The filling material preparation step S10 and the mixing step S21 are included in a resin composition preparation step S20. The resin composition preparation step S20 and the resin-molded body forming step S31 are included in a package preparation step S30.

Hereinafter, a detailed description is given of each step.

Filling Material Preparation Step

The filling material preparation step S10 is a step for preparing the first filling material 202, and includes the first surface treatment step (first step) S11, the second surface treatment step (second step) S12, and the heat treatment step (third step) S13.

First Surface Treatment Step (First Step)

The first surface treatment step S11 performs a chemical surface treatment on a granular base material 202a comprising a first inorganic compound in order to form particles comprising a second inorganic compound through self-assembly thereof on the surface the base material 202a. The particles of the second inorganic compound become the coating material 202b.

As an example, a description is given of a case in which fibrous particles of wollastonite ($CaSiO_3$) are used as the base material 202a comprising the first inorganic compound and calcium fluoride ($CaF_2$) is used as the second inorganic compound. In this case, an aqueous solution of ammonium fluoride is used as an agent to synthesize calcium fluoride, i.e., the second inorganic compound, from wollastonite, i.e., the first inorganic compound.

Dispersing particles of the wollastonite in the aqueous solution of ammonium fluoride produces calcium fluoride on the surface of the particles of the wollastonite, through the chemical reaction represented by the following formula:

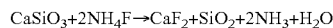

$$CaSiO_3 + 2NH_4F \rightarrow CaF_2 + SiO_2 + 2NH_3 + H_2O$$

The produced calcium fluoride self-assembles into particles thereof on the surfaces of the particles of the wollastonite. The particles of the calcium fluoride serve as the coating material 202b.

Note that, because the particles of calcium fluoride, i.e., coating material 202b, are formed on the surface of the wollastonite, i.e., base material 202a, through self-assembly, the particles of the coating material 202b and the base material 202a are continuously formed without defining a clear interface therebetween. The light-reflective material 202c and the base material 202a define an interface therebetween; and the light-reflective material 202c and the particles of the coating material 202b define an interface therebetween.

Specifically, fibrous wollastonite, i.e., the base material 202a, is added into the aqueous solution of ammonium fluoride, and then the aqueous solution is stirred to form a suspension therein in which the wollastonite is uniformly dispersed. Preferably, the stirring is performed gently so as not to destroy the shape of the wollastonite. While stirring the suspension, reaction is made in a predetermined period of time at a predetermined temperature so as to produce particles of calcium fluoride on the surfaces of wollastonite particles, i.e., the base material 202a.

Preferably, the particles of the coating material 202b produced in the first surface treatment step S11 are nanoscale particles having a particle diameter (mode diameter) of 5 nm to 700 nm, or more preferably 5 nm to 500 nm. Nanoscale particles of a substance are known to have a melting point lower than that of the substance in a bulk state (for example, when the particle size is of the order of several micrometers or more), according to the size of the particles. Accordingly, the coating material 202b being nanoscale particles allows itself to melt at a lower temperature in the next heat treatment step S13.

Note that the above-mentioned diameter of the particles of the coating material 202b can be measured using a photograph taken with a scanning electron microscope (SEM).

The diameter of the particles of the coating material 202b produced in the first surface treatment step S11 can be controlled by the conditions of the above-mentioned reaction, such as temperature, duration, concentration of agent, and pH. The conditions of the reaction are determined so that the dimensions of the particles of the base material 202a are controlled within a range such that the particles of the base material 202a may serve as a filler for enhancing the mechanical strength of the resin composition 20.

Second Surface Treatment Step (Second Step)

The second surface treatment step S12 performs a chemical surface treatment on the surface of the base material 202a on which the coating material 202b has been formed through self-assembly, to form the light-reflective material 202c on the surface of the base material 202a.

Particles having a high refractive index become the light-reflective material 202c. As an example, a description is given of a case in which zirconyl chloride octahydrate; zirconium chloride oxide octahydrate is used as the particles having a high refractive index. Adding an aqueous solution of zirconium chloride oxide to the suspension of wollastonite particles coated with calcium fluoride produces zirconium hydroxide on the surface of the wollastonite particles and on the surface of the calcium fluoride particles. The produced zirconium hydroxide is obtained through hydrolysis in an aqueous solution of zirconium chloride oxide, and thus is in the form of nanoparticles.

The first filling material 202, in which the particles of the coating material 202b and the particles of the light-reflective material 202c have been formed on the surface of the base material 202a by the chemical surface treatments, is subjected to dehydration, drying, and dry sieving steps, and then processed in the heat treatment step S13.

Heat Treatment Step (Third Step)

The heat treatment step S13 heats the first filling material 202 subjected to the chemical surface treatment in the second surface treatment step S12, so as to make the particles of the coating material 202b melt to thereby support the light-reflective material 202c on the surface of the base material 202a.

In this step, the first filling material 202 is heated to a temperature at which the base material 202a and the light-reflective material 202c do not melt but the coating material 202b melts. For example, when the base material 202a is wollastonite, its melting point is about 1500° C. When the coating material 202b is calcium fluoride, its melting point is 1418° C. When the light-reflective material 202c is zirconia, its melting point is about 2700° C. Thus, when the size of the particles of coating material 202b is of the order of several micrometers or more, controlling the heating temperature at a temperature greater than or equal to 1418° C. and less than 1500° C. can cause only the coating material 202b to melt. In contrast, forming the coating material 202b in nanoscale particles enables the particles of the coating material 202b to melt at a temperature lower than the inherent melting point of calcium fluoride, i.e., 1418° C., at a temperature of, for example, several hundreds of degrees Celsius to 1200° C., or, further, several hundreds of degrees Celsius to 1000° C. Therefore, the heat treatment step S13 can be carried out with a lower heating temperature and/or in a shorter duration. In general, even when the difference in the inherent melting point between the first inorganic compound and the second inorganic compound is small, forming the particles of the coating material 202b sufficiently smaller than particles of the base material 202a and in nanoscale dimensions extends the difference in the melting point between the base material 202a and the coating material 202b. This facilitates selectively making only the coating material 202b melt. Also, this may enable use of a combination of a first inorganic compound and a second inorganic compound inherently having a melting point higher than that of the first inorganic compound.

The coating material 202b formed in the first surface treatment step S11 is discretely formed on the surface of the base material 202a by self-assembling. Making the particles of the coating material 202b melt once causes the coating material 202b to extend in a melt state, resulting in an increase in the area of the surface of the base material 202a coated by the coating material 202b.

The coating material 202b may be disposed such as to coat at least a portion of the surface of the base material 202a. It is, however, preferable that the coating material 202b be disposed such as to continuously coat the entire surface of the base material 202a. With this structure, a larger number of particles of the light-reflective material 202c can be supported by the coating material 202b, on the surface of the base material 202a.

Note that the area of the surface of the base material 202a coated by the coating material 202b can be made larger by increasing the temperature and the duration of the heat treatment.

When, like wollastonite, the particles of the first inorganic compound used as the base material 202a contain impurities such as an iron component, the heat treatment is preferably carried out in a reducing atmosphere or an inert gas atmosphere. When the heat treatment is carried out in an oxidizing atmosphere such as the atmosphere, the iron component is converted into an oxide that exhibits greater visual light absorption. This reduces the light reflectivity of the resin composition 20 containing the first filling material 202.

Taking this into account, the heat treatment is preferably carried out in a reducing gas atmosphere or an inert gas atmosphere to reduce oxidation of the iron component, thereby inhibiting the reduction in the light reflectivity of resin composition 20 containing the first filling material 202.

Examples of the reducing atmosphere include a reducing gas atmosphere such as a hydrogen gas and a carbon monoxide gas. Examples of the inert gas atmosphere include an argon gas atmosphere.

Carrying out the above steps manufactures the first filling material 202.

Resin Composition Preparation Step

The resin composition preparation step S20 prepares the resin composition 20 containing the resin 201 and the first filling material 202. The resin composition preparation step S20 includes the filling material preparation step S10 and the mixing step S21.

Mixing Step S21

The mixing step S21 produces the resin composition 20 by adding the first filling material 202 prepared in the filling material preparation step S10 to the light-transmissive resin 201 and mixing them.

In the mixing step S21 of the present embodiment, the second filling material 203, which is for imparting light reflectivity, may be blended into the resin composition 20 in addition to the first filling material 202. Optionally, the resin composition 20 may be mixed further with the above-mentioned filling materials and additives. Preferably, the first filling material 202 and the second filling material 203 are uniformly dispersed so as to reduce unevenness in the light reflection of the resin-molded body 22 using the resin composition 20.

The mixing step S21 can be carried out by a known mixing device such as a twin screw extruder.

Package Preparation Step

The package preparation step S30 manufactures the package 2 including the resin-molded body 22. The package preparation step S30 includes the resin composition preparation step S20 and the resin-molded body forming step S31.

Resin-Molded Body Forming Step

The resin-molded body forming step S31 forms the resin-molded body 22 using the resin composition 20 prepared in the resin composition preparation step S20. As the resin forming method for forming the resin-molded body 22, a known resin forming method, such as transfer molding, injection molding, compression molding, and extrusion molding can be used. The resin forming method is selected as appropriate according to whether the resin 201 used for the resin composition 20 is a thermosetting resin or a thermoplastic resin and according to the structure of the package 2.

For example, when the resin 201 is a thermoplastic resin and the package 2 is structured such that the lead electrodes 21 are held by the resin-molded body 22, injection molding may be used. Specifically, the resin-molded body 22 can be formed by clamping lead electrodes 21 between vertically-divided molding dies and injecting melted resin composition 20 into the molding dies.

Reducing the pressure applied to the resin composition 20 in forming the resin may make the resin-molded body 22 have isotropic mechanical strength. The resin-molded body 22 having the isotropic mechanical strength may inhibit the occurrence of a separation between the resin-molded body 22 and the sealing member 4 at a bonding interface therebetween. Meanwhile, using particles having an elongated shape, such as a fibrous shape, a needle-like shape, or a stick-like shape as the first filling material 202 and increasing the pressure applied in forming the resin may make the resin-molded body 22 have anisotropic mechanical strength. The resin-molded body 22 having the anisotropic mechanical strength may enhance the mechanical strength of the resin-molded body 22 in a predetermined direction.

Light-Emitting Element Mounting Step

The light-emitting element mounting step S40 mounts a light-emitting element 3 in the package 2 manufactured in the package preparation step S30.

In the present embodiment, the light-emitting element 3 is bonded to a bottom surface 2b of the recess 2a of the package 2 using a die-bonding member; and pad electrodes of the light-emitting element 3 and the lead electrodes 21 are electrically connected using wiring members such as wires.

Sealing Member Forming Step

The sealing member forming step S50 seals the light-emitting element 3 and the lead electrodes 21 arranged in the recess 2a by forming the sealing member 4 in the recess 2a of the package 2.

Carrying out the package preparation step S30, the light-emitting element mounting step S40, and the sealing member forming step S50 as described above manufactures the light-emitting device 1.

Variant Embodiment

The light-emitting device 1 is not limited to the side-view type. The light-emitting device 1 may be of the top-view type, in which the light extraction direction is perpendicular to the mounting surface. The light-emitting device 1 may be of the chip scale package type or chip size package (CSP) type, in which the package 2 does not have the recess 2a and the light-reflective resin-molded body 22 is provided such as to cover side surfaces of the light-emitting element 3. Furthermore, the light-emitting device 1 may be of the chip on board (COB) type, in which the light-emitting element 3 is arranged on a plate-shaped board and the light-reflective resin-molded body 22 is formed in a frame shape on the board such as to surround the light-emitting element 3.

The form of the light-emitting device 1 is not limited to those described above so long as the resin-molded body 22 is arranged to surround at least a portion of the light-emitting element 3 such that the resin-molded body 22 is used to reflect the light from the light-emitting element 3.

Examples

Next, examples of light-emitting devices in each of which a light-emitting element is mounted on a package using a resin composition containing a first filling material and comparative examples are described with reference to FIGS. 5A to 9B.

Figure 5A:
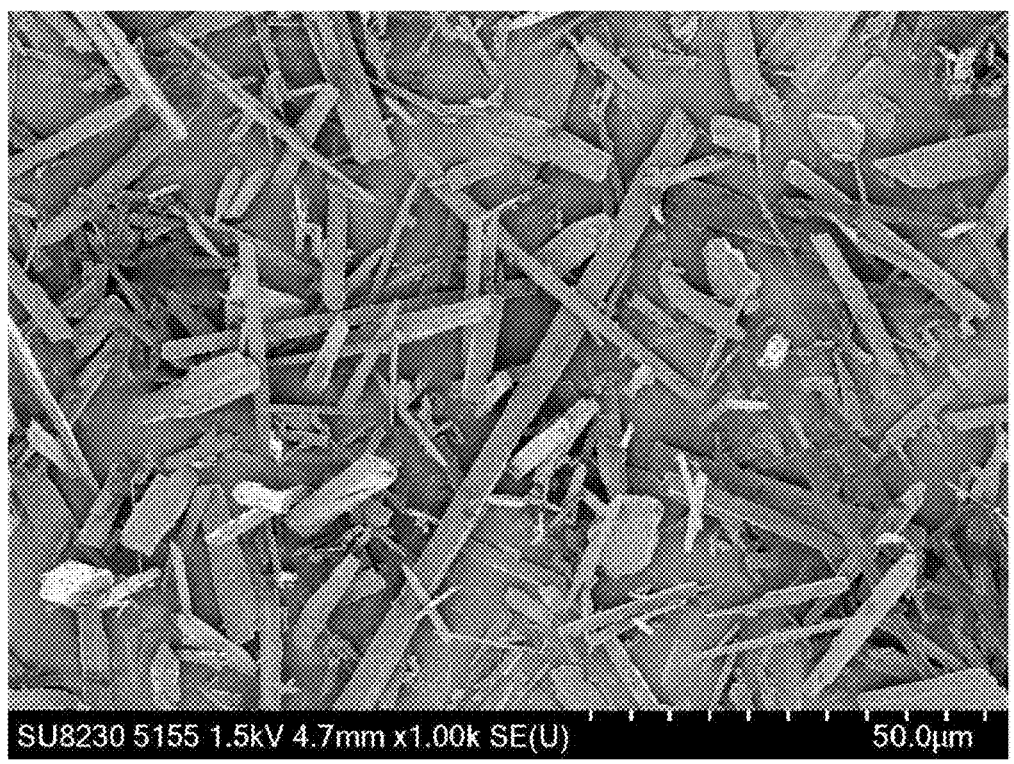
FIG. 5A is a photograph of a first filling material before being subjected to the first surface treatment in an example of the present disclosure.
Figure 5B:
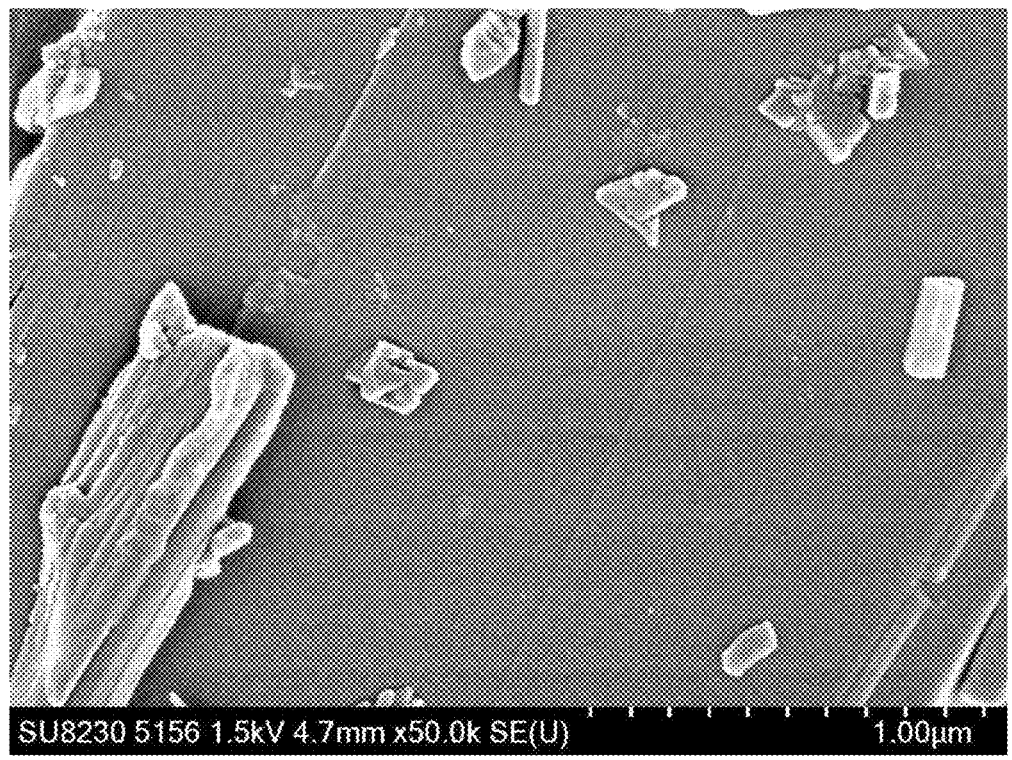
FIG. 5B is a photograph enlarging a part of the first filling material shown in FIG. 5A.
Figure 6A:
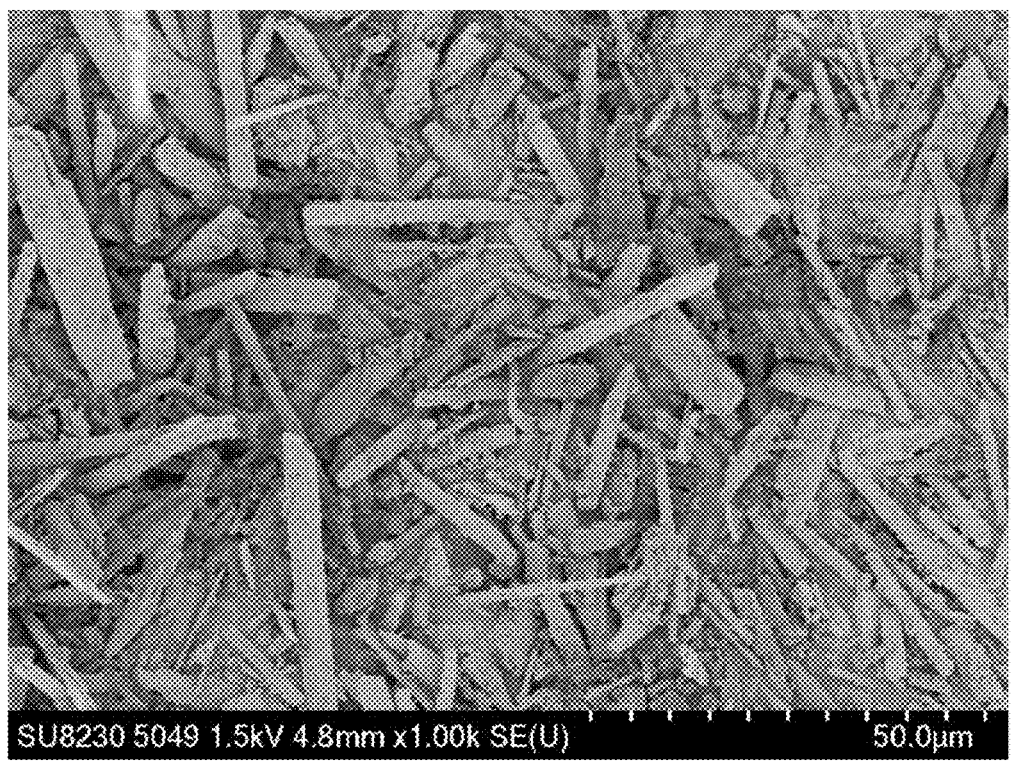
FIG. 6A is a photograph showing a first filling material that has been subjected to the second surface treatment in the example.
Figure 6B:
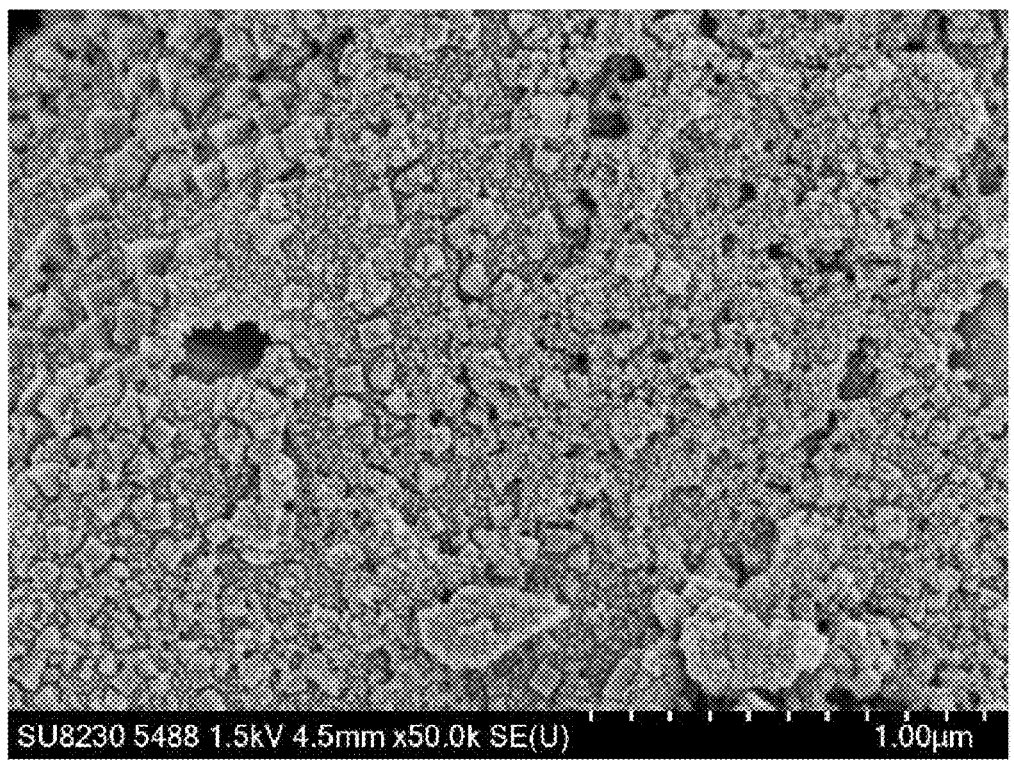
FIG. 6B is a photograph enlarging a part of the first filling material shown in FIG. 6A.
Figure 7A:
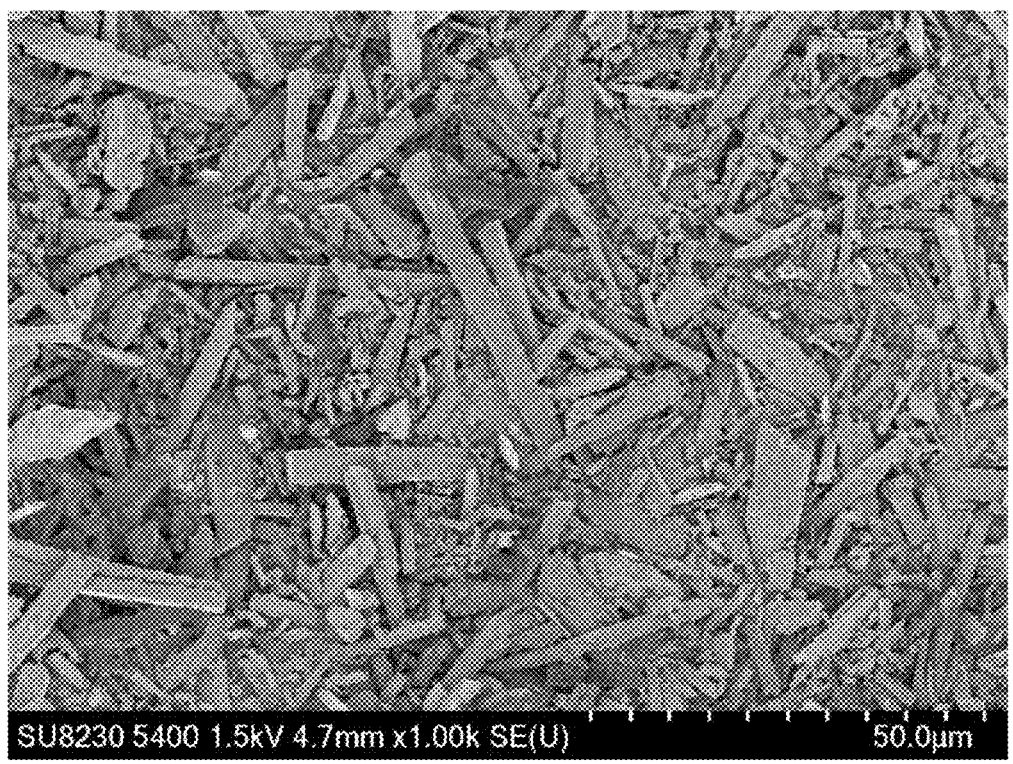
FIG. 7A is a photograph showing a first filling material that has been subjected to the heat treatment at a temperature of 950° C. in an example of the present disclosure.
Figure 7B:
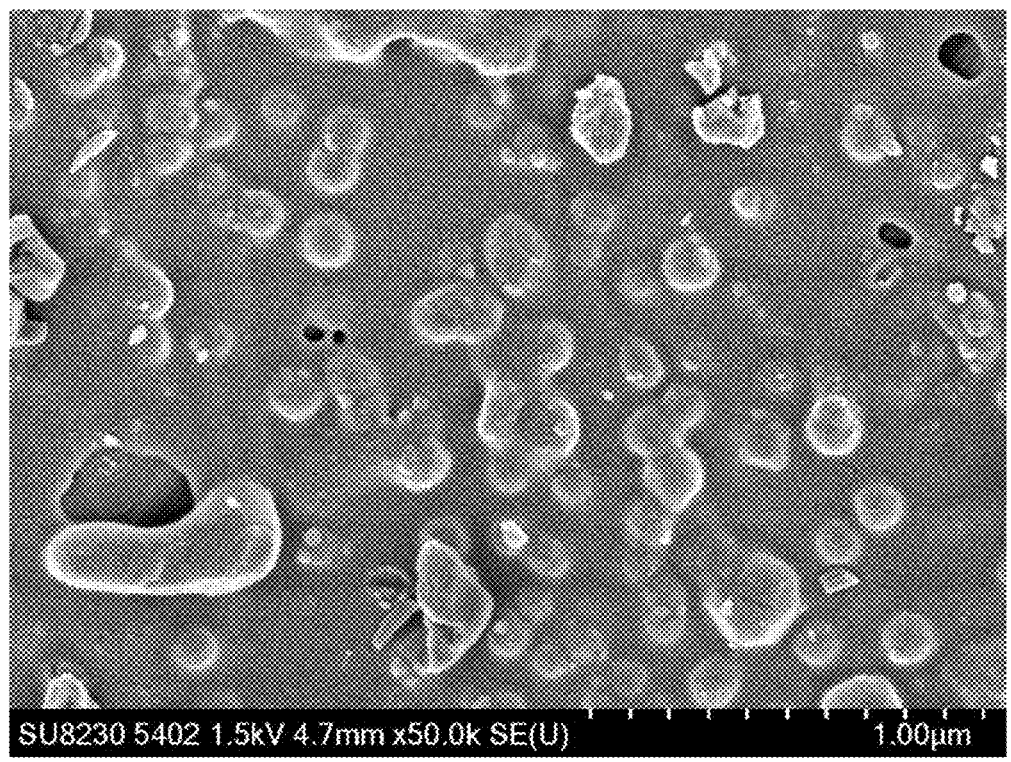
FIG. 7B is a photograph enlarging a part of the first filling material shown in FIG. 7A.
Figure 8A:
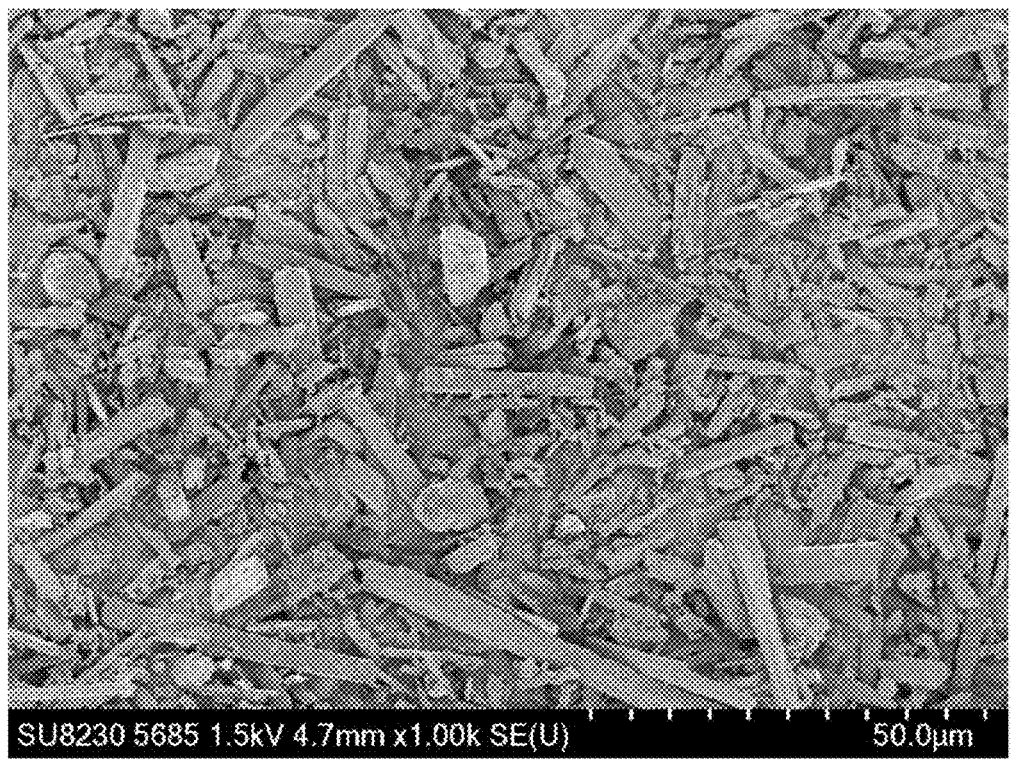
FIG. 8A is a photograph showing a first filling material that has been subjected to the heat treatment at a temperature of 970° C. in an example of the present disclosure.
Figure 8B:
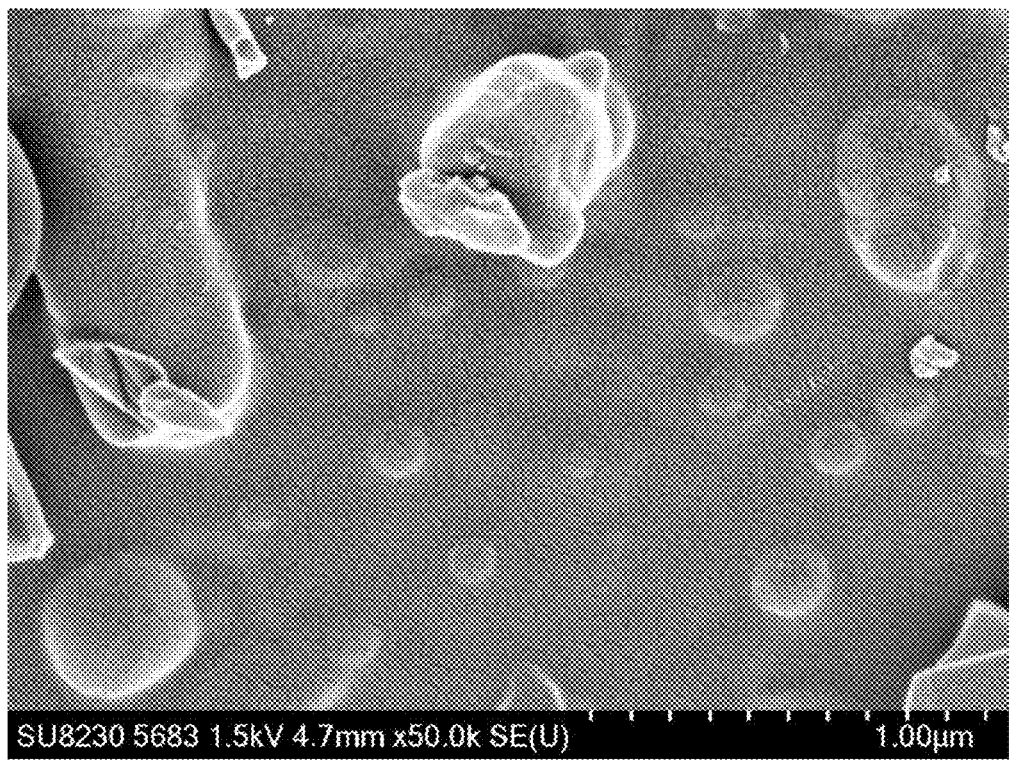
FIG. 8B is a photograph enlarging a part of the first filling material shown in FIG. 8A.
Figure 9A:
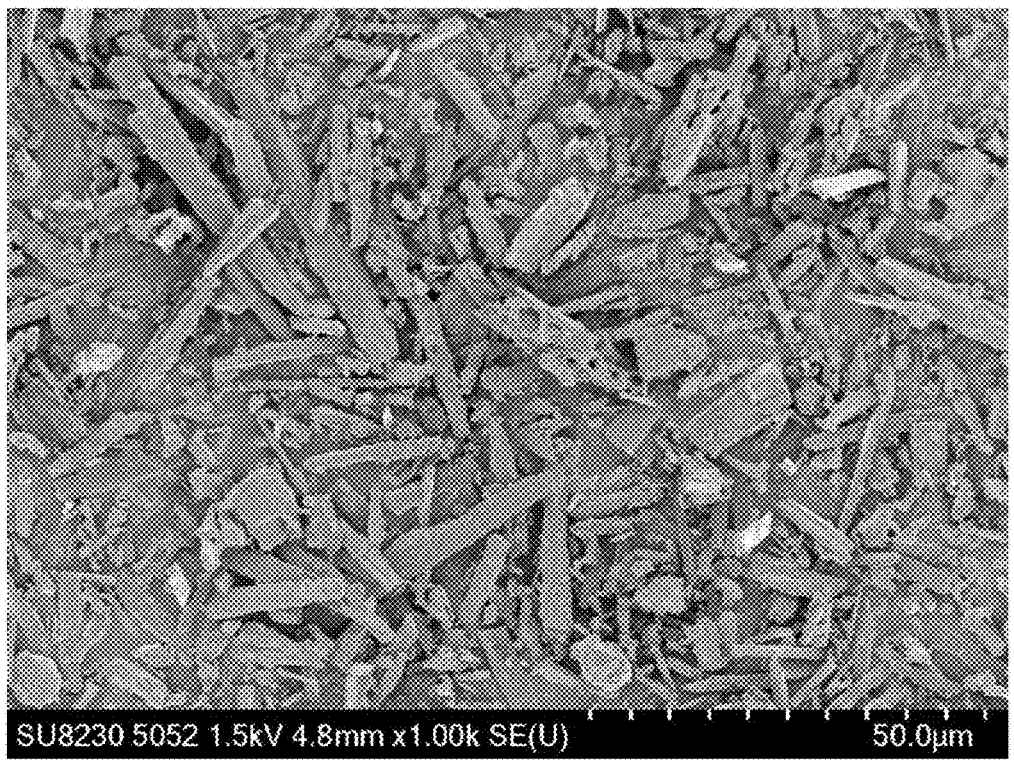
FIG. 9A is a photograph showing a first filling material that has been subjected to the heat treatment at a temperature of 1000° C. in an example of the present disclosure.
Figure 9B:
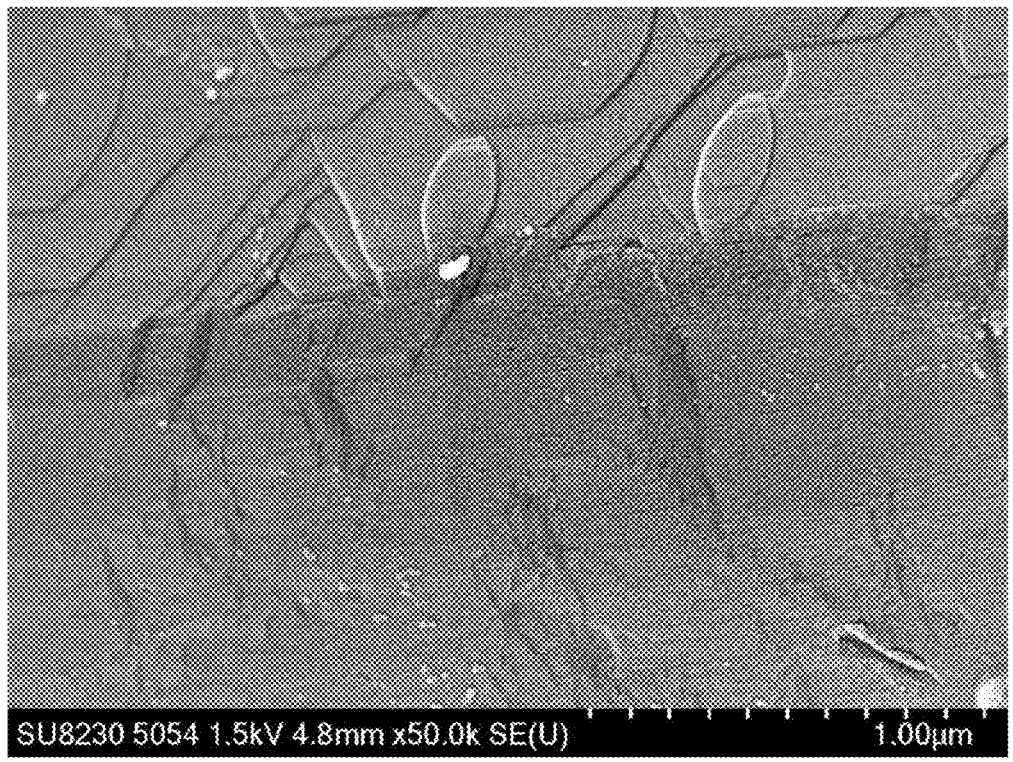
FIG. 9B is a photograph enlarging a part of the first filling material shown in FIG. 9A.

FIG. 5A is a photograph of a first filling material before subjected to the first surface treatment step. FIG. 5B is a photograph enlarging a part of the first filling material shown in FIG. 5A. FIG. 6A is a photograph showing a first filling material that has been subjected to the second surface treatment step. FIG. 6B is a photograph enlarging a part of the first filling material shown in FIG. 6A. FIG. 7A is a photograph showing a first filling material that has been subjected to the heat treatment step at a temperature of 950° C. in an example. FIG. 7B is a photograph enlarging a part of the first filling material shown in FIG. 7A. FIG. 8A is a photograph showing a first filling material that has been subjected to the heat treatment step at a temperature of 970° C. in an example. FIG. 8B is a photograph enlarging a part of the first filling material shown in FIG. 8A. FIG. 9A is a photograph showing a first filling material that has been subjected to the heat treatment step at a temperature of 1000° C. in an example. FIG. 9B is a photograph enlarging a part of the first filling material shown in FIG. 9A.

In FIGS. 5A, 6A, 7A, 8A, and 9A, a reading of 10 divisions in the scale corresponds to 50 µm. In FIGS. 5B, 6B, 7B, 8B, and 9B, a reading of 10 divisions in the scale corresponds to 1 µm, and each figure is a photograph enlarging the surface of one particle of each first filling material. In FIG. 6B, a large number of small particles having a rectangular column shape are particles of calcium fluoride serving as the coating material, and a large number of yet smaller particles are particles of zirconium hydroxide serving as the light-reflective material. Those particles are formed on the surface of particles of wollastonite serving as the base material.

Original Material of Resin Composition

The following materials were used for the light-emitting devices of the examples and comparative examples.

Base material of the first filling material: Wollastonite (Manufactured by KINSEI MATEC CO., LTD.; product name: SH1800; average fiber diameter: 3.5 µm; average fiber length: 28 µm)

Agent used in the chemical surface treatment of the first filling material: Aqueous ammonium fluoride solution Agent used for forming the light-reflective material of the first filling material: zirconyl chloride octahydrate; zirconium chloride oxide octahydrate Second filling material: Titanium oxide (manufactured by ISHIHARA SANGYO KAISHA, LTD.; product name: CR-90-2; average particle diameter: 0.45 µm)

Resin: Polyamide resin PA6T (manufactured by Mitsui Chemicals, Inc.;

product name: ARLEN® C2000)

Package: Side-view type (manufactured by NICHIA Corporation; product name: NSSW304D)

Examples

Packages of the examples were produced by the following procedure:

First Surface Treatment Step

A wollastonite, the base material of the first filling material, was dispersed in a 10% aqueous ammonium fluoride solution with a mass ratio of 1:10. While gently stirring the aqueous ammonium fluoride solution so as not to break the wollastonite, reaction was carried out for three hours at a temperature of 70° C. After the reaction, steps of dehydration and cleaning were carried out to obtain a cake (agglomerate) of wollastonite having a surface on which particles of calcium fluoride were formed.

Second Surface Treatment Step

The cake of wollastonite was put into an aqueous solution of zirconium chloride oxide (content ratio of Zr is 0.5%) with a mass ratio of 1:10 (the mass ratio of the wollastonite, on the surface of which the particles of calcium fluoride had been formed, to the aqueous solution of zirconium chloride oxide was 1:10). The aqueous solution was stirred gently to carry out reaction for two hours. After the reaction, steps of cleaning, dehydration, drying, and dry sieving were carried out to obtain wollastonite having a surface on which the particles of calcium fluoride and particles of zirconium hydroxide have been formed.

Heat Treatment Step

Next, at each of the predetermined temperatures 950° C., 970° C., and 1000° C., a heat treatment was carried out for two hours in a reducing atmosphere so as to obtain a first filling material in which a part or whole of the coating material, composed of the particles of calcium fluoride formed on the surface of the particles of the wollastonite serving as a base material, melted and spread to support the particles of zirconium oxide.

Note that, prior to carrying out the heat treatment at each predetermined temperature, the ambient temperature was increased from a room temperature to the predetermined temperature taking four hours.

Now, a description is given of the difference in the shape of the coating material due to the difference in the heating temperature with reference to FIGS. 5A to 9B.

As shown in FIG. 5B, the first filling material before surface treatment was applied was solely composed of the base material and had a flat surface.

As shown in FIG. 6B, the particles of the coating material self-assembled in the first surface treatment step had a diameter of about 30 nm to about 50 nm, and particles of the light-reflective material having a diameter of several nanometers were also formed on the surface of the particles of the coating material and between the particles of the coating material.

As shown in FIG. 7B, when the heating temperature was 950° C., the particles of the coating material self-assembled in the chemical surface treatment remained in a granular form. The area of the base material coated by each of the particles of the coating material was larger than before the heat treatment was carried out. However, the base material had many regions where the base material was exposed between the particles of the coating material. The melted particles of the coating material supported particles of the light-reflective material.

As shown in FIG. 8B, when the heating temperature was 970° C., the particles self-assembled in the chemical surface treatment still remained in a granular form, but the area of the base material coated by the particles of the coating material was larger than when the heating temperature was 950° C. The melted particles of the coating material supported particles of the light-reflective material.

As shown in FIG. 9B, when the heating temperature was 1000° C., substantially the entire surface of the base material was coated by the coating material. In this case, the particles of the coating material self-assembled in the chemical surface treatment had almost no granularity left. The melted particles of the coating material supported particles of the light-reflective material.

Comparisons between FIGS. 5A, 6A, 7A, 8A, and 9A showed that each of the first filling materials remained in a fibrous form even after being subjected to the surface treatments and the heat treatment under any of the conditions tested. Therefore, any of those first filling materials can be used as a filler for enhancing the mechanical strength of the resin composition.

Mixing Step

Next, two kinds of filling materials, i.e., a first filling material having a surface on which the coating material was coated and a second filling material composed of titanium oxide, were mixed with a polyamide resin in the following ratio to obtain a resin composition.

The mass ratio of the polyamide resin, the first filling material, and the second filling material in the resin composition was: 45 (polyamide resin): 15 (first filling material): 40 (second filling material). The polyamide resin, the first filling material, and the second filling material were melted and kneaded at a temperature higher than the melting point of the polyamide resin, e.g., 320° C., so as to uniformly disperse the first filling material and the second filling material in the polyamide resin. The kneading operation was carried out to disperse the first filling material and the second filling material into the polyamide resin, so gently as not to break the wollastonite, i.e., the base material of the first filling material. After the kneading operation, pellets of the resin composition were produced by extrusion molding.

Resin Molded-Body Forming Step

Next, the pellets of the resin composition were melted at a temperature of about 320° C. and injected into an injection molding mold in which lead electrodes are placed, to form a resin-molded body. The injection molded resin-molded body was then cooled to be solidified, to produce a package. This package has a recess having a bottom surface and side walls, wherein at least a portion of a lead frame is exposed on the bottom surface and the side walls are formed of the resin-molded body.

Comparative Example

A package of the comparative example was produced in the following procedure:

The same material as the original wollastonite material used as the first filling material in the examples and the same material as the titanium oxide used as the second filling material in the examples were prepared.

The first filling material and the second filling material were kneaded in polyamide resin so as to be dispersed therein, in the same manner as the examples. The mass ratio between the polyamide resin, the first filling material, and the second filling material was 45 (polyamide resin):15 (first filling material):40 (second filling material). Then, a package was produced in the same manner as the resin-molded body forming step of the examples, except the conditions described above.

Evaluation

Light emitting devices were produced by mounting the same light-emitting element on the packages of one of the examples and the comparative example. An evaluation was carried out as to a total luminous flux of the light emitted from each of those light-emitting devices when the light-emitting element of the light-emitting device was made to emit light. For each of the example and the comparative example, the luminous flux of each light-emitting device was measured by an integral total luminous flux measurement apparatus.

Note that the light-emitting device of the example was the one produced using the first filling material subjected to the heat treatment step for two hours at a temperature of 950° C.

The evaluation result showed that, if the total luminous flux of the light-emitting device of the comparative example was taken as 100, the total luminous flux of the light-emitting device of the example was 100.4. Namely, it was confirmed that using the first filling material of the example enabled improvement in the light emission output of the light-emitting device.

The light-emitting device according to the present disclosure can be used for lighting devices, displays, backlights for liquid crystal display devices of cellular phones, auxiliary light sources for moving picture illumination, and other general light sources for consumer use.

What is claimed is:
1. A filling material comprising:
a base material, wherein the base material comprises a first inorganic compound containing a Group II element;
a coating material coating at least a portion of a surface of a particle of the base material, wherein the coating material comprises a second inorganic compound con- taining the Group II element, and the second inorganic compound is different from the first inorganic compound; and a light-reflective material disposed on the surface of the base material and supported by the coating material, wherein the light-reflective material comprises a third inorganic compound having a refractive index higher than a refractive index of the first inorganic compound.

2. The filling material of claim 1, wherein the second inorganic compound is selected from the group consisting of a fluoride including the Group II element, a phosphate including the Group II element, and a sulfate including the Group II element.

3. The filling material of claim 1, wherein the third inorganic compound is selected from the group consisting of titanium oxide, zirconium oxide, zinc oxide, and aluminum oxide.

4. The filling material of claim 1, wherein the base material and the coating material have an interface therebetween including at least a portion through which the base material and the coating material are continuously formed.

5. The filling material of claim 1, wherein the Group II element is Ca or Mg.

6. The filling material of claim 1, wherein the first inorganic compound is calcium silicate.

7. The filling material of claim 1, wherein the first inorganic compound is wollastonite.

8. The filling material of claim 1, wherein the base material is a fibrous material having an average fiber diameter of 0.1 μm to 15 μm, an average fiber length of 1 μm to 100 μm, and an average aspect ratio of 3 or more.

9. The filling material of claim 1, wherein the coating material continuously coats a part or whole of the surface of the particle of the base material.

10. A resin composition comprising:
a light-transmissive resin; and
the filling material of claim 1,
wherein the filling material is dispersed in the light-transmissive resin, and
wherein the light-transmissive resin has a refractive index lower than the refractive index of the first inorganic compound, higher than a refractive index of the second inorganic compound, and lower than the refractive index of the third inorganic compound.

11. A package having a recess for mounting a light-emitting element, wherein the recess has an inner surface, and wherein at least a portion of the inner surface comprises the resin composition of claim 10.

12. A light-emitting device comprising:
a package of claim 11; and
a light-emitting element mounted in the recess.

13. The resin composition of claim 10,
wherein the light-transmissive resin is a thermoplastic resin or a thermosetting resin.

14. The resin composition of claim 10,
wherein a content of the filling material in the resin composition is from 5 percent by mass to 70 percent by mass.

15. The resin composition of claim 10,
wherein the filling material is a first filling material, and
wherein the resin composition further comprises a second filling material having a higher reflectivity than the first filling material.

16. The resin composition of claim 15,
wherein the second filling material comprises titanium oxide or aluminum oxide.

17. The resin composition of claim 15,
wherein a content of the second filling material in the resin composition is from 10 percent by mass to 60 percent by mass.

18. The package of claim 11,
wherein an external shape of the package is an elongated, substantially rectangular parallelepiped shape.

19. The package of claim 11,
wherein the recess has a thickness of 100 μm or less at the portion where the inner surface of the recess comprises the resin composition.

20. A resin composition comprising:
a light-transmissive resin; and
the filling material of claim 1,
wherein the filling material is dispersed in the light-transmissive resin,
the refractive index of the first inorganic compound is 1.60 to 1.80,
the light-transmissive resin has a refractive index of 1.48 to 1.59,
the second inorganic compound has a refractive index of 1.35 to 1.47, and
the refractive index of the third inorganic compound is 1.70 to 2.70.

* * * * *